(12) United States Patent
Lin et al.

(10) Patent No.: US 12,274,070 B2
(45) Date of Patent: Apr. 8, 2025

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Po-Ting Lin, Taichung (TW); Wei-Chih Wen, Hsinchu County (TW); Kai-Wen Cheng, Taichung (TW); Wu-Wei Tsai, Taoyuan (TW); Yu-Ming Hsiang, New Taipei (TW); Yan-Yi Chen, Taipei (TW); Hai-Ching Chen, Hsinchu (TW); Yu-Ming Lin, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 191 days.

(21) Appl. No.: 17/857,047

(22) Filed: Jul. 4, 2022

(65) Prior Publication Data

US 2024/0008287 A1 Jan. 4, 2024

(51) Int. Cl.
*H01L 29/78* (2006.01)
*H01L 23/522* (2006.01)
*H01L 23/528* (2006.01)
*H01L 29/51* (2006.01)
*H01L 29/66* (2006.01)
*H10B 53/20* (2023.01)

(52) U.S. Cl.
CPC ......... *H10B 53/20* (2023.02); *H01L 23/5226* (2013.01); *H01L 23/5283* (2013.01); *H01L 29/516* (2013.01); *H01L 29/6684* (2013.01); *H01L 29/78391* (2014.09)

(58) Field of Classification Search
CPC ........ H10B 53/20; H10B 53/40; H10B 80/00; H10B 53/03; H01L 23/5226; H01L 23/5283; H01L 29/516; H01L 29/6684; H01L 29/78391
USPC ....................................................... 257/295
See application file for complete search history.

(56) References Cited

U.S. PATENT DOCUMENTS

| | | | |
|---|---|---|---|
| 2006/0170019 A1* | 8/2006 | Ozaki | H01L 28/57 257/295 |
| 2006/0175643 A1* | 8/2006 | Nomura | H01L 28/65 257/295 |
| 2009/0174006 A1* | 7/2009 | Maxson | H01L 21/76885 438/643 |
| 2010/0123176 A1* | 5/2010 | Nishimura | H10B 53/30 257/295 |

(Continued)

Primary Examiner — Sheikh Maruf
(74) Attorney, Agent, or Firm — JCIPRNET

(57) ABSTRACT

A memory device and a manufacturing method thereof is described. The memory device includes a transistor structure over a substrate and a ferroelectric capacitor structure electrically connected with the transistor structure. The ferroelectric capacitor structure includes a top electrode layer, a bottom electrode layer and a ferroelectric stack sandwiched there-between. The ferroelectric stack includes a first ferroelectric layer, a first stabilizing layer, and one of a second ferroelectric layer or a second stabilizing layer. Materials of the first stabilizing layer and a second stabilizing layer include a metal oxide material.

17 Claims, 9 Drawing Sheets

(56) References Cited

U.S. PATENT DOCUMENTS

| | | | | |
|---|---|---|---|---|
| 2012/0032299 A1* | 2/2012 | Wang | ...... | H01L 28/75 257/532 |
| 2012/0056161 A1* | 3/2012 | Avouris | ...... | H01L 29/42384 257/E29.241 |
| 2013/0052753 A1* | 2/2013 | Wang | ...... | H10B 53/00 257/E21.011 |
| 2013/0149794 A1* | 6/2013 | Wang | ...... | H01L 28/65 257/E21.008 |
| 2013/0264620 A1* | 10/2013 | Yu | ...... | H01L 23/5329 438/653 |
| 2013/0295693 A1* | 11/2013 | Sashida | ...... | H01L 28/56 438/3 |
| 2015/0004718 A1* | 1/2015 | Sun | ...... | H01L 21/76849 438/3 |
| 2015/0060969 A1* | 3/2015 | Matsuura | ...... | H10B 53/30 257/295 |
| 2015/0171177 A1* | 6/2015 | Cheng | ...... | H01L 29/66545 257/288 |
| 2016/0064518 A1* | 3/2016 | Liu | ...... | H01L 21/76895 438/586 |
| 2017/0139260 A1* | 5/2017 | Kimoto | ...... | G02F 1/134336 |
| 2022/0139934 A1* | 5/2022 | Müller | ...... | H01L 29/78391 257/295 |
| 2023/0097641 A1* | 3/2023 | Neumann | ...... | H01L 21/76834 257/295 |
| 2023/0100860 A1* | 3/2023 | Chang | ...... | H10B 53/30 257/295 |
| 2023/0116719 A1* | 4/2023 | Karpov | ...... | H01L 28/40 257/295 |
| 2023/0121892 A1* | 4/2023 | Chavan | ...... | H01L 29/4966 257/532 |

* cited by examiner

SEMICONDUCTOR DEVICE AND MANUFACTURING METHOD THEREOF

BACKGROUND

As the size of the integrated circuit keeps decreasing, the integration density of the component or device gradually increases. Semiconductor memory devices include volatile memories and non-volatile memories. For semiconductor memory devices, the increased memory cell density leads to compact structure designs with reduced sizes but maintaining the performance of the semiconductor memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
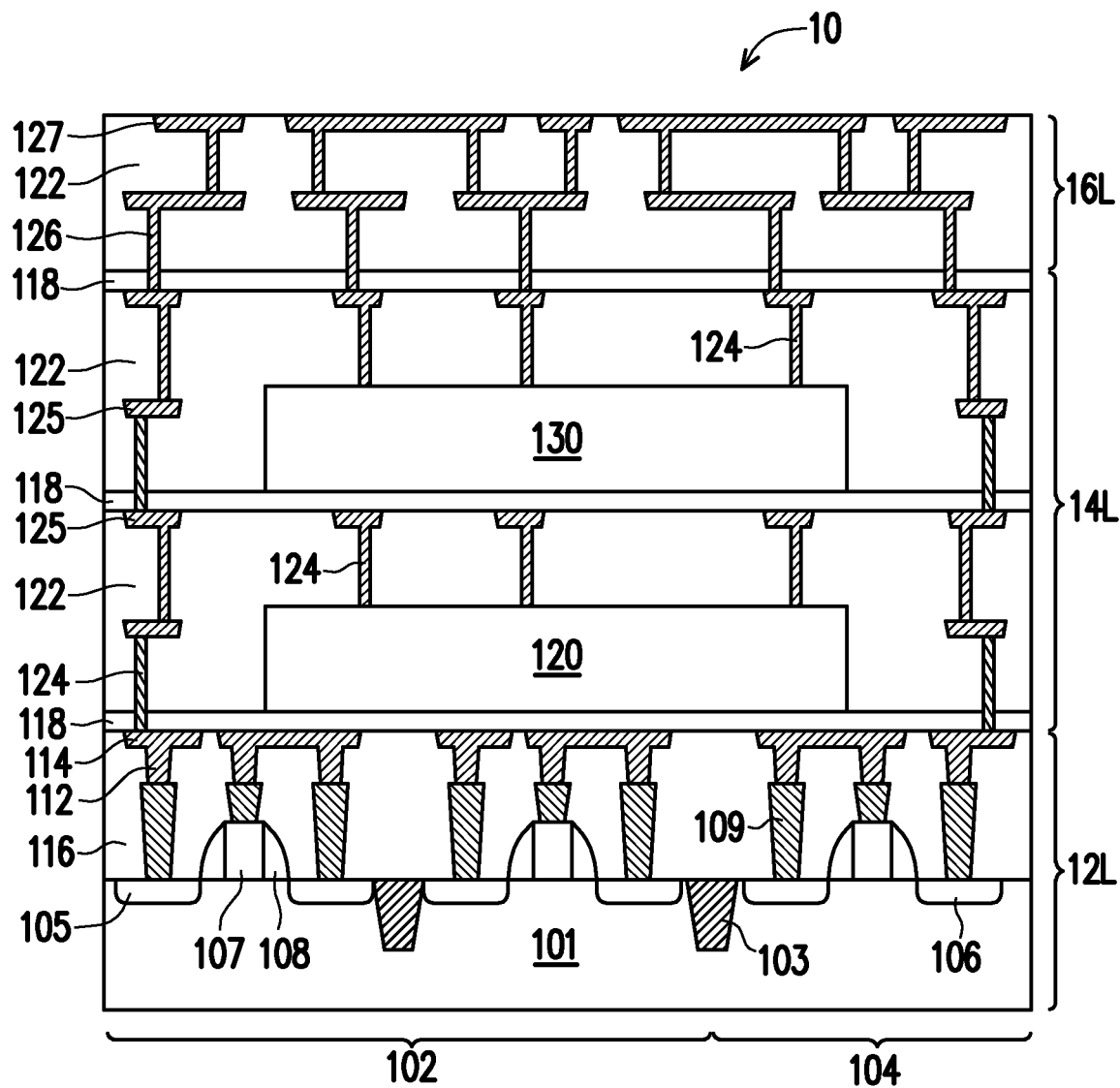
FIG. 1 illustrates a schematic cross-sectional view of a semiconductor device with integrated memory devices according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to embodiments of the present disclosure, a ferroelectric memory structure is described. In some embodiments, the ferroelectric memory structure includes a ferroelectric capacitor having one or more electrodes and at least one ferroelectric layer. In the embodiments of the present disclosure, the ferroelectric phase of the ferroelectric layer is stabilized through the addition/inclusion of the stabilizing layer onto/into the ferroelectric layer, which helps to preserve or maintain ferroelectric phase crystals in the ferroelectric layer.

Among various ferroelectric materials, hafnium oxide based ferroelectric material film with a fluorite structure has good ferroelectricity and are compatible with complementary metal-oxide semiconductor (CMOS) manufacturing processes. The ferroelectric properties of hafnium oxide based ferroelectric film relate with the specific crystalline phase, i.e. the ferroelectric phase (e.g. orthorhombic phase, o-phase), and the stabilization of the o-phase enhances the ferroelectric behavior of the film. According to some embodiments of the present disclosure, the ferroelectric phase of the hafnium oxide based ferroelectric layer can be stabilized through the addition/inclusion of the stabilizing layer, which helps to preserve or maintain ferroelectric phase crystals in the ferroelectric layer. According to the embodiments of the present disclosure, the inclusion of the stabilizing layer(s) into the ferroelectric layer(s) can prohibit the formation of non-ferroelectric phases and improve the ferroelectric property of the ferroelectric film. For a ferroelectric memory device, the addition of the stabilizing layer(s) to the ferroelectric film(s) helps to maintain the ferroelectric phase and achieve good endurance properties.

FIG. 1 illustrates a cross-sectional view of a semiconductor device 10 according to some embodiments of the present disclosure. In some embodiments, the semiconductor device 10 is formed with integrated memory devices 120 and 130. In some embodiments, the semiconductor device 10 includes field effect transistor (FET) devices 110 formed through the front-end-of-line (FEOL) manufacturing processes and three-dimensional (3D) memory devices formed through the back-end-of-line (BEOL) manufacturing processes. In one embodiment, the FET devices 110 include metal oxide semiconductor field effect transistors (MOSFETs), and the at least one of the memory devices 120, 130 includes ferroelectric random access memory (FeRAM) devices. It is understood that MOSFETs are used as examples, and other kinds of FEOL devices such as planar transistors, thin film transistors, fin type FETs (FinFETs) or gate-all-around (GAA) transistors may be used herein and included within the scope of the present disclosure. That is, the memory devices 120, 130 may be integrated with or in any suitable semiconductor devices. In FIG. 1, the details of the memory devices 120, 130 are not shown and further details will be described later in subsequent figures.

As illustrated in FIG. 1, the semiconductor device 10 includes different regions for forming different types of circuits. For example, the semiconductor device 10 may include a first region 102 for forming logic circuits, and a second region 104 for forming, e.g., peripheral circuits, input/output (I/O) circuits, electrostatic discharge (ESD) circuits, and/or analog circuits. Other regions for forming other types of circuits are possible and are fully intended to be included within the scope of the present disclosure. The semiconductor device 10 includes a substrate 101. In some embodiments, the substrate 101 may be a bulk semiconductor substrate, such as a silicon substrate, doped or undoped, or an active layer of a semiconductor-on-insulator (SOI) substrate. In some embodiments, the substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. For example, additional electrical components, such as resistors, capacitors, inductors, diodes, or the like, may be formed in or on the substrate 101 during the FEOL manufacturing processes.

As seen in FIG. 1, the FET devices 110 are formed on the substrate 101, and isolation regions 103, such as shallow trench isolation (STI) regions, are formed between or around the FET devices 110. In some embodiments, the FET device 110 includes a gate electrode 107 are formed over the substrate 101 with gate spacers 108 formed along sidewalls of the gate electrode 107, and source/drain regions 105/106, such as doped regions or epitaxial source/drain regions, are formed on opposing sides of the gate electrode 107. In some embodiments, conductive contacts 109, such as gate contacts and source/drain contacts, are formed over and electrically coupled to respective underlying electrically conductive features (e.g., gate electrodes 107 or source/drain regions 105/106). In some embodiments, a dielectric layer 116, such as an inter-layer dielectric (ILD) layer, is formed over the substrate 101 and covering the source/drain regions 105/106, the gate electrode 107 and the contacts 109, and other electrically conductive features, such as metallic interconnect structures comprising conductive vias 112 and conductive lines 114, are embedded in the dielectric layer 116. It is understood that the dielectric layer 116 may include more than one dielectric layers of the same or different dielectric materials. Collectively, the substrate 101, the FET devices 110, the contacts 109, conductive features 112/114, and the dielectric layers 116 shown in FIG. 1 may be referred to as the front-end level 12L.

Referring to FIG. 1, dielectric layers 118 and dielectric layers 122 are formed over the dielectric layer 116 in alternation. In one embodiment, at least one of the dielectric layers 118 may include an etch stop layer (ESL). In some embodiments, the materials of the dielectric layers 118 may be different from the materials of the dielectric layers 116 and 122. In some embodiments, the material of the dielectric layer(s) 118 includes silicon nitride or carbide formed by plasma-enhanced physical vapor deposition (PECVD). In some embodiments, one or more of the dielectric layers 118 may be omitted. In some embodiments, the dielectric layers 116 and 122 may be formed of any suitable dielectric material, such as silicon oxide, silicon nitride, silicon oxynitride, phosphosilicate glass (PSG), borosilicate glass (BSG), boron-doped phosphosilicate glass (BPSG), or low-k materials, formed by a suitable method, such as spin coating, physical vapor deposition (PVD), chemical vapor deposition (CVD), or the like. In FIG. 1, memory devices 120 and 130, each of which may include a plurality of memory cells, are formed in the dielectric layers 122 and coupled to electrically conductive features (e.g., metallic vias 124 and metallic lines 125) in the dielectric layers 122.

In FIG. 1, the memory devices 120 and 130 are formed at different layers of the dielectric layers 122, and the memory device 120 is formed at the lower layer and the memory device 130 is formed at the upper layer. In some embodiments, the memory devices 120 and 130 have the same or similar configuration. In some embodiments, the memory devices 120 and 130 have different structural configurations. Although two layers of memory devices are depicted in FIG. 1, other numbers of layers of memory devices, such as one layer, three layers, or more, are also possible and are encompassed within the scope of the present disclosure. Collectively, the layers of memory device 120 and 130 are referred to as the memory device level 14L or a memory region of the semiconductor device 10. The memory device level 14L may be formed during the BEOL processes of semiconductor manufacturing. The memory devices 120 and 130 may be formed in the BEOL processes at any suitable locations within the semiconductor device 10, such as over the first region 102, over the second region 104, or over a plurality of different regions.

Still referring to FIG. 1, after the memory device level 14L is formed, an interconnect level 16L including electrically conductive interconnecting features (e.g., metallic vias 126 and metallic patterns 127) embedded in the dielectric layer(s) 122 is formed over the memory device level 14L. Suitable methods may be employed to form the interconnect level 16L and the details are not described herein. In some embodiments, the interconnect level 16L may electrically be connected with the electrical components formed in/on the substrate 101 to form functional circuits. In some embodiments, the interconnect structure 140 may also electrically couple the memory devices 120, 130 to the FET devices 110 and/or the components in/on the substrate 101. In addition, the memory devices 120 and 130 may be electrically coupled to an external circuit or an external device through the structure of the interconnect level 16L. In some embodiments, the memory devices 120 and 130 are electrically coupled to the FET devices 110 of the front-end level 12L and/or other electrical components formed in the substrate 101, and are controlled or accessed (e.g., written to or read from) by functional circuits of the semiconductor device 10. Alternatively, the memory devices 120, 130 are electrically coupled to (e.g., controlled or accessed) an external circuit of another semiconductor device through the structure of the interconnect level 16L.

FIG. 2 to FIG. 6 illustrate schematic cross-sectional views of structures produced at various stages of a manufacturing method of a memory device according to some embodiments of the present disclosure. According to some embodiments, the memory device may be a memory device formed with a ferroelectric material such as a FeRAM device. The memory devices depicted in the following paragraphs may be used as one or more of the memory devices 120 and 130 in FIG. 1.

Figure 2:
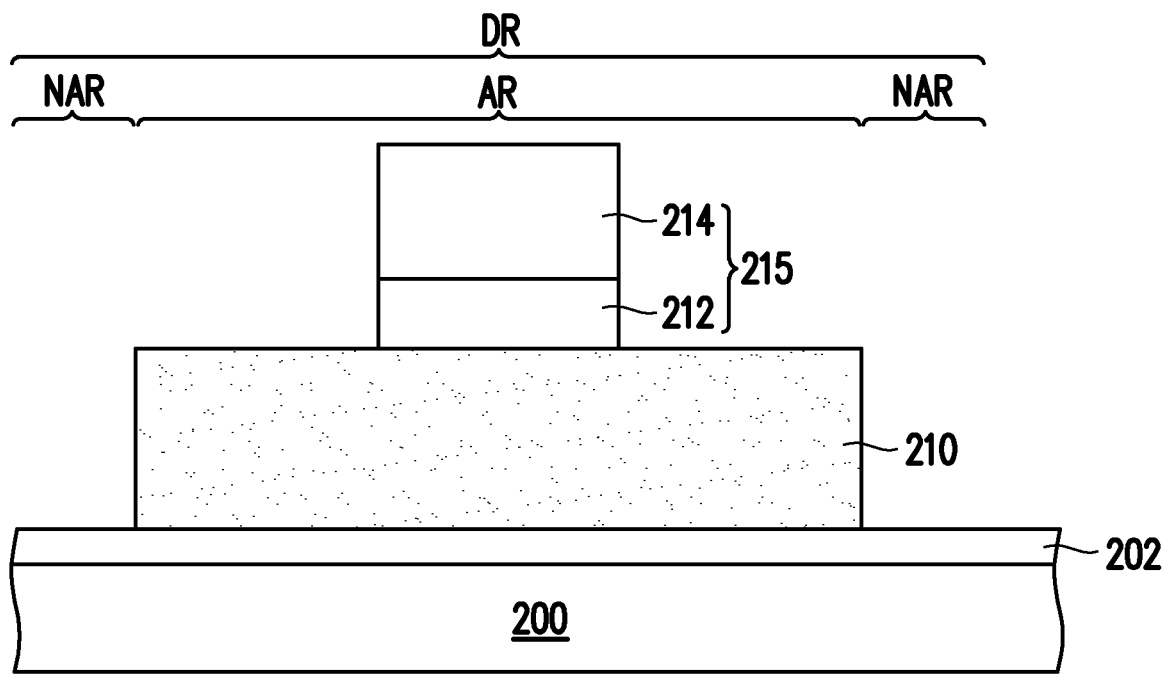
FIG. 2 to FIG. 6 are schematic cross-sectional views showing structures produced at various stages of a manufacturing method of a memory device according to some embodiments of the present disclosure.

Referring to FIG. 2, in some embodiments, a substrate 200 having a dielectric layer 202 is provided. In FIGS. 2-6, only a portion of a device region DR of the substrate 200 is shown for illustration purposes. In some embodiments, as shown in FIG. 2, the dielectric layer 202 and the substrate 200 may be part of the front-end level 12L as described in the previous embodiments. In some embodiments, the substrate 200 includes a semiconductor substrate. In one embodiment, the substrate 200 comprises a crystalline silicon substrate or a doped semiconductor substrate (e.g., p-type semiconductor substrate or n-type semiconductor substrate). In some embodiments, the substrate 200 may include one or more active component such as transistors, diodes, optoelectronic devices and/or one or more passive components such as capacitors, inductors and resistors. It is understood that the substrate 200 and the dielectric layer 202 may not be considered part of the memory device. Although the substrate 200 and the dielectric layer 202 are shown in FIG. 2, some structural features may be omitted in the following figures for simplicity.

In some embodiments, as shown in FIG. 2, a semiconductor material layer 210 is formed over the substrate 200. In some embodiments, the material of the semiconductor material layer 210 includes indium gallium zinc oxide (IGZO), or a similar conducting oxide semiconductor material such as indium tin oxide (ITO), indium tungsten oxide (IWO), indium zinc oxide (IZO) or zinc tin oxide (ZTO) or combinations thereof. In some embodiments, the formation of the semiconductor material layer 210 includes a deposition process such as chemical vapor deposition (CVD), atomic layer deposition (ALD), and physical vapor deposition (PVD). In one embodiment, a layer of a semiconductor material is blanketly deposited over the substrate 200 through the PVD process and then patterned to form the semiconductor material layer 210 on the substrate 300, and an active region AR and non-active regions NAR are defined through the patterning process. In some embodiments, the memory device(s) is formed in the active region AR, while non-active region(s) NAR surrounding the active region AR may include insulator materials for isolation.

Referring to FIG. 2, a gate dielectric layer 212 and a gate layer 214 are formed on the semiconductor material layer 210. In some embodiments, a gate dielectric material layer (not shown) and a gate material layer (not shown) are sequentially formed over the semiconductor material layer 210, and then are patterned into the stack of the gate dielectric layer 212 and the gate layer 214 through photolithographic and etching processes.

In some embodiments, the gate dielectric layer 212 includes one or more high-k dielectric materials, such as zirconium oxide, hafnium oxide, aluminum oxide, titanium oxide, tantalum oxide, $Gd_2O_3$, $BaTiO_3$, $LaO_2$, $Y_2O_3$, HfZrO, HfLaO, HfTaO, HfTiO, or combinations thereof. In some embodiments, the gate dielectric layer 212 includes one or more materials selected from aluminum oxide, hafnium oxide, tantalum oxide and zirconium oxide. In some embodiments, the formation of the gate dielectric material layer includes one or more deposition processes selected from CVD (such as, PECVD and laser-assisted CVD), ALD and PVD (such as, sputtering and e-beam evaporation). For example, the gate dielectric layer 212 may be formed by depositing a composite layer of $HfO_2/Al_2O_3$ through ALD.

In some embodiments, the material of the gate layer 214 includes one or more metallic materials. In some embodiments, the materials of the gate layer 214 include aluminum (Al), titanium (Ti), tungsten (W), tantalum (Ta), nitride thereof, combinations thereof, and/or alloys thereof. For example, the gate layer 214 may include one or more stacked layers of TiN, TaN, W/TiN, TiN/TiAl/TiN or TiN/TiAl/TaN. In some embodiments, the formation of the gate layer 214 includes one or more deposition processes selected from CVD (such as, PECVD and laser-assisted CVD), ALD, and PVD (such as, sputtering, and e-beam evaporation). In some embodiments, the formation of the gate layer 214 includes a plating process.

As shown in FIG. 2, in exemplary embodiments, the stack structure of the gate dielectric layer 212 and the gate layer 214 partially covers the underlying semiconductor material layer 210 exposing portions of the semiconductor material layer 210. In some embodiments, the semiconductor material layer 210 is located within the active region AR, and the gate structure 215 of the gate dielectric layer 212 and the gate layer 214 is located within the active region AR. The sidewalls of the gate structure 215 of the gate dielectric layer 212 and the gate layer 214 in FIG. 2 may be shown to be vertically aligned or coplanar, it is also possible that the gate dielectric layer 212 and the gate layer 214 are patterned into substantially different pattern designs or configurations. It is understood that the various layers of the stack structure(s) may have different patterns or configurations depending on product designs.

Figure 3:
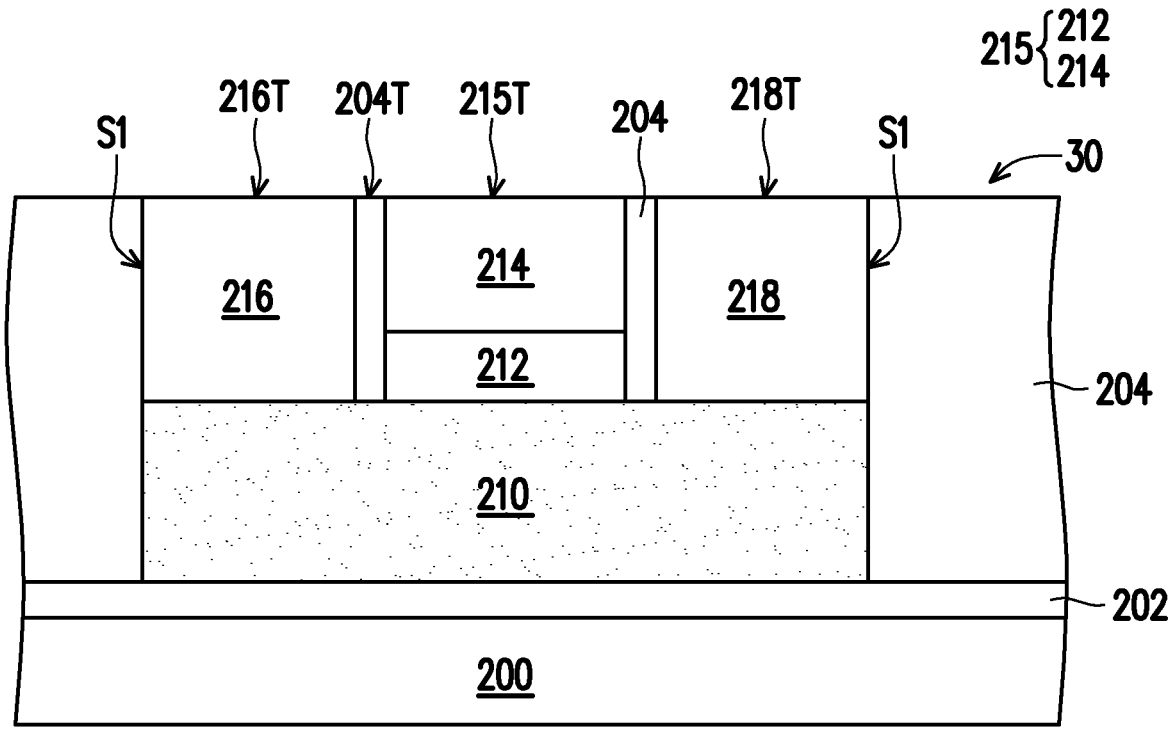

In FIG. 3, an inter-layer dielectric (ILD) layer 204 is formed over the dielectric layer 202 and the substrate 200 covering the gate structure 215 of the gate dielectric layer 212 and the gate layer 214. In some embodiments, the material of the ILD layer 204 includes silicon oxide, silicon nitride, silicon oxynitride, or one or more low-k dielectric materials. Examples of low-k dielectric materials include silicate glass such as fluoro-silicate-glass (FSG), phospho-silicate-glass (PSG) and boro-phospho-silicate-glass (BPSG), BLACK DIAMOND®, SILK®, FLARE®, hydrogen silsesquioxane (HSQ), fluorinated silicon oxide (SiOF), amorphous fluorinated carbon, parylene, BCB (bis-benzocyclobutenes), or a combination thereof. It is understood that the ILD layer 204 may include one or more dielectric materials or one or more dielectric layers. In some embodiments, the ILD layer 204 is formed to a suitable thickness through CVD (such as flowable CVD (FCVD), PECVD, high Density Plasma CVD (HDPCVD), sub-atmospheric CVD (SACVD) and low-pressure CVD (LPCVD)), spin-on coating, or other suitable methods.

Referring to FIG. 3, openings S1 are formed in the ILD layer 204 to respectively expose portions of the semiconductor material layer 210. As seen in FIG. 3, the openings S1 are shown with substantially vertical sidewalls but it is understood that the openings S1 may be formed with slant sidewalls if feasible.

Thereafter, in FIG. 3, source and drain terminals 216 and 218 are formed in the openings S1. In some embodiments, the source and drain terminals 216 and 218 are respectively located at opposite sides of the gate structure 215 and on the semiconductor material layer 210. In certain embodiments, the source and drain terminals 216 and 218 may be formed with one or more of a seed layer, an adhesion layer and a barrier layer, and any suitable materials and formation methods may be utilized. In some embodiments, the source and drain terminals 216 and 218 is formed by filling a metallic material into the openings. For example, the metallic material may include one or more materials selected tungsten (W), ruthenium (Ru), molybdenum (Mo), tantalum (Ta), titanium (Ti), alloys thereof, and nitrides thereof, for example. In some embodiments, the metallic material is formed by CVD or PVD. In alternative embodiments, the formation of the metallic material may include performing a plating process (such as electrochemical plating (ECP)). In one embodiment, each of the source and drain terminals 216 and 218 includes a tungsten contact with a titanium nitride barrier layer.

In some embodiments, during the formation of the source and drain terminals 216 and 218, extra materials may be removed by performing a planarization process, an etching process, or other suitable processes. In some embodiments, the planarization process may include performing a chemical mechanical polishing (CMP) process. In some embodiments, as seen in FIG. 3, the top surface 204T of the ILD layer 204 is substantially flush with and levelled with the top surfaces 216T, 218T of the terminals 216, 218. Also, the top surface 204T of the ILD layer 204 is substantially flush with and levelled with the top surface 215T of the gate structure 215. In some embodiments, a transistor structure 30 is formed with the gate structure 215 and the source and drain terminals 216 and 218, and the semiconductor material layer 210 functions as the channel layer of the transistor. In some embodiments, the transistor structure 30 is a top-gated transistor structure or a front gate transistor structure.

Figure 4:
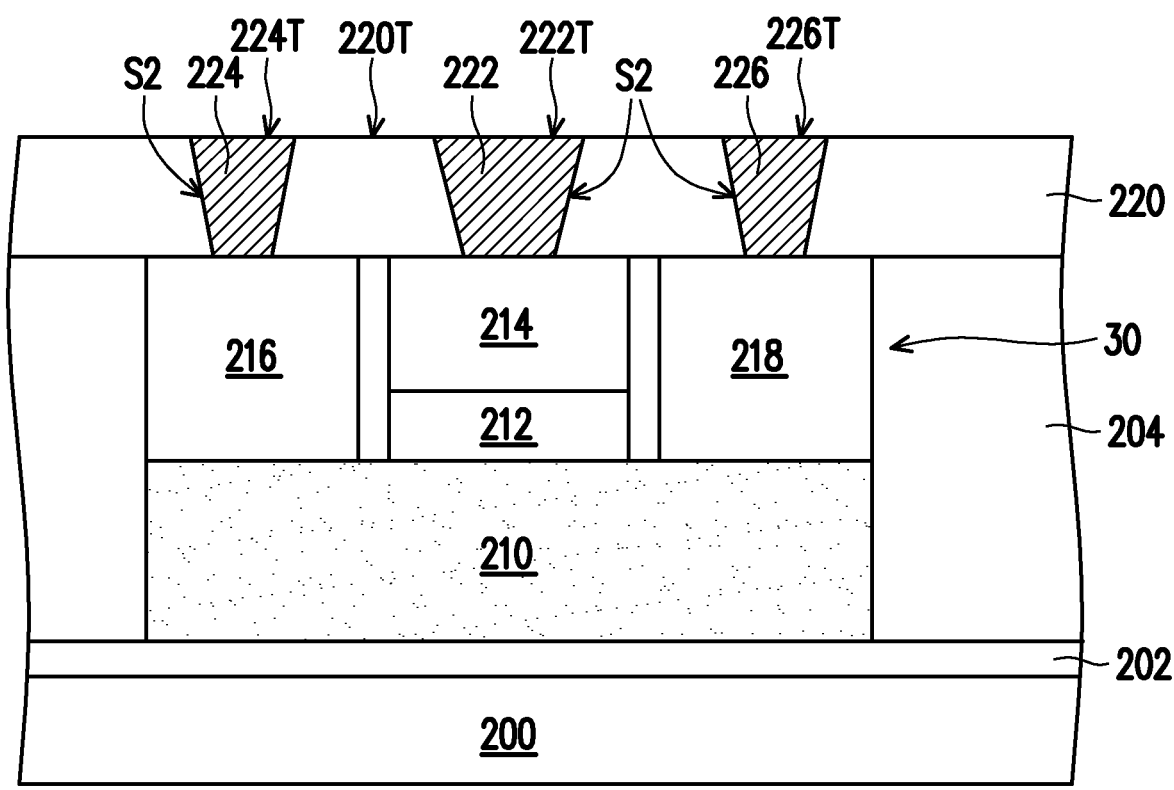

Referring to FIG. 4, in certain embodiments, another ILD layer 220 is formed on the ILD layer 204, covering the gate structure 215 and the source and drain terminals 216 and 218. In some embodiments, the ILD layer 220 includes via openings S2 respectively exposing the top surfaces of the underlying gate structure 215 and the source and drain terminals 216 and 218 Later, vias 222, 224 and 226 are formed within the via openings S2 and are respectively connected to the underlying gate structure 215, the source terminal 216 and the drain terminal 218. In some embodiments, the vias 222, 224 and 226 are formed by filling the via openings S2 with a metal material (not shown) by performing a plating process such as electrochemical plating (ECP) or electroless plating, a PVD process or a CVD process. In some embodiments, the metal material for the vias 222, 224 and 226 includes, for example, copper, copper-aluminum alloys, tantalum, titanium, tungsten, cobalt, alloys thereof, or other suitable metal materials.

In some embodiments, the extra metal material may be removed by performing a planarization process, an etching process, or other suitable processes. In some embodiments, the planarization process may include performing a CMP process. In some embodiments, as seen in FIG. 4, the top surface 220T of the ILD layer 220 is substantially flush with and levelled with the top surfaces 222T, 224T and 226T of the vias 222, 224 and 226.

Figure 5:
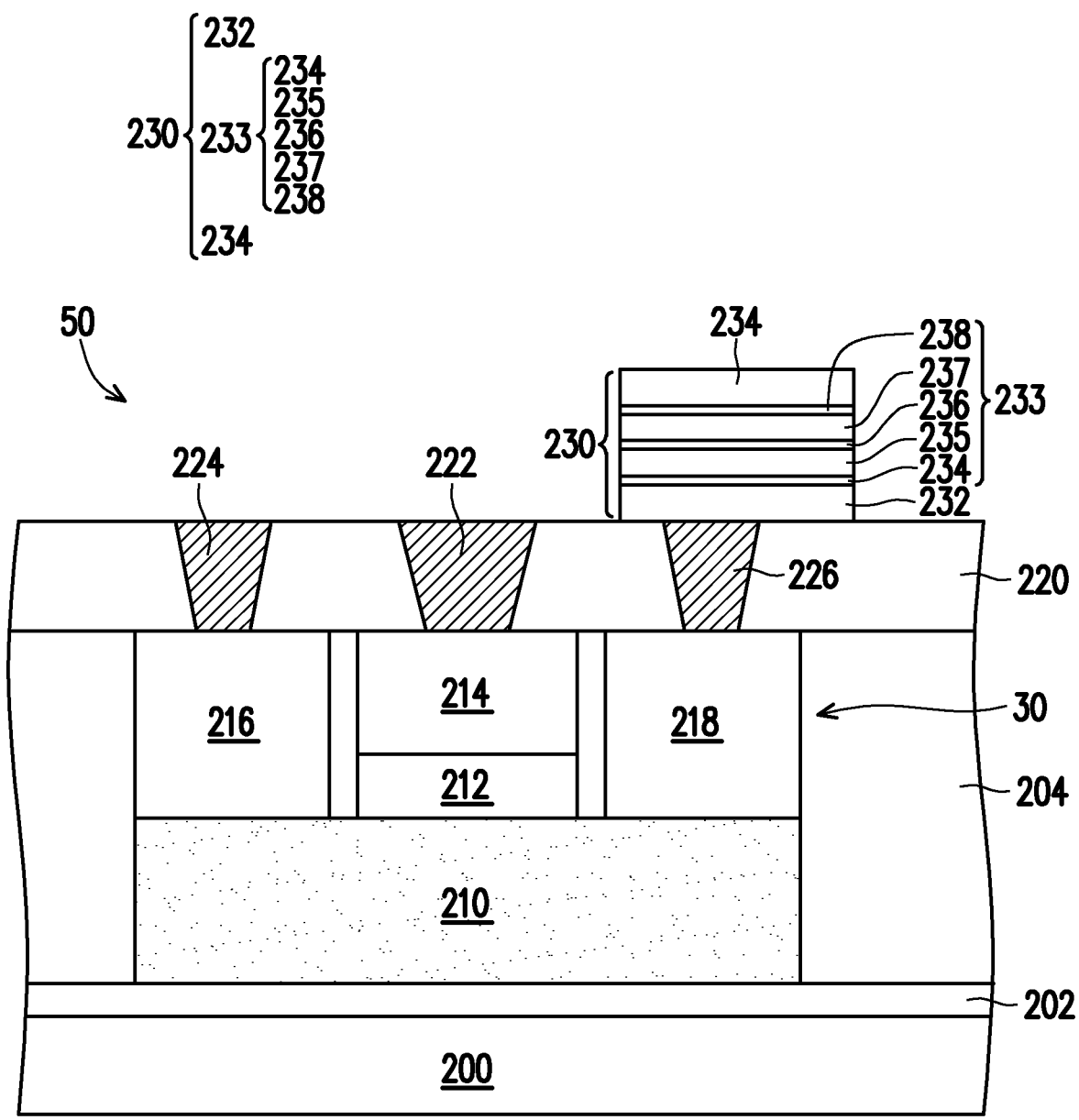

Referring to FIG. 5, a stacked structure 230 is formed on the ILD layer 220 and connected with the via 226. In some embodiments, the stacked structure 230 comprises a bottom electrode layer 232, a top electrode layer 234 and a multi-layered ferroelectric stack 233 sandwiched there-between. As seen in FIG. 5, in some embodiments, the structure of the ferroelectric stack 233 including a first stabilizing layer 234, a first ferroelectric layer 235, a second stabilizing layer 236, a second ferroelectric layer 237 and a third stabilizing layer 238 vertically stacked in sequence (from bottom to top) is sandwiched between the bottom electrode layer 232 and the top electrode layer 234. As seen in FIG. 5, in some embodiments, the first stabilizing layer 234 is located between and vertically separates the first ferroelectric layer 235 and the bottom electrode layer 232. Similarly, in FIG. 5, the third stabilizing layer 238 is located between and vertically separates the second ferroelectric layer 237 and the top electrode layer 234. In some embodiments, the second stabilizing layer 236 is located between the above and below ferroelectric layers 237 and 235.

In some embodiments, the formation of the stacked structure 230 involves forming a first metallic material for the bottom electrode layer 232, sequentially forming layers of a stabilizing material and a ferroelectric material in alternation for the stack 233, and then forming a second metallic material for the top electrode layer 234, and patterning these layers through one or more etching processes using a masking pattern. As seen in FIG. 5, in some embodiments, the sidewalls of the stacked structure 230 are shown to be vertically aligned or coplanar, it is also possible that the top electrode layer 234, the ferroelectric stack 233 and the bottom electrode layer 232 are patterned into substantially different pattern designs or configurations. It is understood that the various layers of the stack structure(s) may have different patterns or configurations depending on product designs.

In some embodiments, the materials of the ferroelectric material for the first and second ferroelectric layers 235, 237 include hafnium zirconium oxide (e.g., HfZrO), zirconium oxide (e.g., $ZrO_2$), hafnium oxide undoped or doped with lanthanum (La), silicon (Si), or aluminum (Al), or other suitable ferroelectric material(s). In some embodiments, the material of the first and second ferroelectric layers 235 and 237 comprises $Hf_xZr_{1-x}O_2$ with x ranging from 0.1 to 0.9. In some embodiments, the materials of the first and second ferroelectric layers 235 and 237 comprise $Hf_{0.5}Zr_{0.5}O_2$. In some embodiments, the formation of the ferroelectric material includes one or more deposition processes selected from sputtering, CVD (such as, PECVD and laser-assisted CVD), ALD and PVD (such as, e-beam evaporation). In some embodiments, the material of the first ferroelectric layer 235 is different from the material of the second ferroelectric layer 237. In some embodiments, the material of the first ferroelectric layer 235 is substantially the same as the material of the second ferroelectric layer 237.

In some embodiments, the materials of the stabilizing layers 234, 236 and 238 comprise a metal oxide such as indium oxide (e.g. $In_2O_3$), gallium oxide (e.g. $Ga_2O_3$) and tantalum oxide (e.g. $Ta_2O_5$). In some embodiments, the materials of the stabilizing layers 234, 236 and 238 comprise one or more types of rare earth metal oxides including lanthanum oxide (e.g. $La_2O_3$), cerium oxide (e.g. $CeO_2$), yttrium oxide (e.g. $Y_2O_3$), and scandium oxide (e.g. $Sc_2O_3$). In some embodiments, the process for forming the stabilizing layer 234, 236 or 238 may include depositing a metal oxide material by sputtering, PVD, CVD, ALD, or any combination of thereof. In some embodiments, the process for forming the stabilizing layer 234, 236 or 238 may include depositing a metal oxide material by ALD and optionally performing an annealing process. In some embodiments, the first stabilizing layers 234 comprises the same material as the second stabilizing layers 236 and the third stabilizing layers 238. In some embodiments, the materials of the stabilizing layers 234, 236 and 238 are different. In some embodiments, the materials of the top electrode layer 234 and the bottom electrode layer 232 include tungsten, tantalum nitride, titanium nitride, ruthenium (Ru), molybdenum (Mo), or some other suitable metallic material(s). In some embodiments, the metallic material of the electrode layer 232 or 234 is formed by CVD, PVD, ALD, or plating.

In some embodiments, the metal elements in the stabilizing layer(s) have larger ionic radius, and the presence of the stabilizing layer(s) intensifies the stress toward the crystals in the ferroelectric layer(s) and increases the polarization of the ferroelectric layer(s).

In some embodiments, the total thickness of the first and second ferroelectric layers 235 and 237 may range from about 100 Angstroms to about 500 Angstroms, about 150 Angstroms to about 450 Angstroms, or other suitable range. In one embodiment, each ferroelectric layer 235 or 237 has individual thicknesses ranging from about 30 Angstroms to about 90 Angstroms, or about 50 Angstroms to about 80 Angstroms. In some embodiments, each of the stabilizing layers 234, 236 and 238 has individual thicknesses ranging from about 1 Angstrom to about 10 Angstroms, or other suitable range. In some embodiments, the bottom and top electrode layers 232, 234 have about the same thickness. In some embodiments, the bottom and top electrode layers 232, 234 have different thicknesses.

While the stacked structure 230 is illustrated with a bottom electrode layer 232, a top electrode layer 234 and a five-layered ferroelectric stack 233, it is understood that the stacked structure may only have one electrode and/or less or more layers of stabilizing layers and ferroelectric layers in various embodiments. In some embodiments, the stacked structure 230 is employed as a ferroelectric capacitor in the ferroelectric memory structure.

As seen in FIG. 5, in some embodiments, the first stabilizing layer 234 that is formed on the bottom electrode layer 232 can stabilize the ferroelectric phase of the later formed ferroelectric layer 235. In FIG. 5, in some embodiments, the second stabilizing layer 236 that is formed on the below ferroelectric layer 235 can stabilize the ferroelectric phase of the later formed ferroelectric layer 237. In some embodiments, the second stabilizing layer 236 functions as dopant provider at the interfaces with the above and below ferroelectric layers 237 and 235. Also, the stabilizing layer 234 or 238 that is located between and physically separates the ferroelectric layer and the electrode layer may reduce the formation of possible dead layer and relax the matching requirement between the metallic material of the electrode and the ferroelectric material.

According to embodiments of the present disclosure, a ferroelectric memory structure including a ferroelectric capacitor is described. In some embodiments, the ferroelectric capacitor may comprise one or more electrodes and at least one ferroelectric layer. In the embodiments of the present disclosure, the ferroelectric phase of the ferroelectric layer is stabilized or promoted through the addition/inclusion of the stabilizing layer onto/into the ferroelectric layer, which helps to elevate the formation of ferroelectric phase crystals or maintain the ferroelectric phase crystals in the ferroelectric layer. According to the embodiments of the present disclosure, the ferroelectric phase of the hafnium oxide based ferroelectric layer is stabilized or increased through the addition/inclusion of the stabilizing layer. Due to the presence of the stabilizing layer, the ratio of the orthorhombic phase crystals in the ferroelectric layer becomes dominant and may be as high as 90%. Compared with the ferroelectric film undergoing doping treatment that requires higher annealing temperature for stabilizing ferroelectric phase crystallization, the additional stabilizing layer(s) enhances the stable formation of the ferroelectric phase (e.g. o-phase) crystallization without the need of raising the annealing temperature. According to the embodiments of the present disclosure, the inclusion of the stabilizing layer(s) into the ferroelectric layer(s) can prohibit the formation of non-ferroelectric phases such as monoclinic phase (m-phase) and tetragonal phase (t-phase) and improve the ferroelectric property of the ferroelectric film. For the ferroelectric film(s) in a memory device, through the inclusion of the stabilizing layer, the obtained ferroelectric film(s) maintains stable ferroelectric phase and has good ferroelectric properties (increased remnant polarization) so that the early breakdown of the capacitor is prevented and the endurance of the ferroelectric memory structure is elevated.

In some embodiments, the memory structure 50 shown in FIG. 5 is a ferroelectric memory structure including a one-transistor-one-capacitor (1T1C) ferroelectric memory device, and the structure includes the transistor 30 and the stacked structure 230 (as the ferroelectric capacitor). The ferroelectric memory structure 50 shown in FIG. 5 may be described as a part of a 1T1C memory structure, such ferroelectric memory structure 50 may alternatively be described as a part of a two-transistor-two-capacitor (2T2C) memory structure in alternative embodiments. In some embodiments, the stacked structure 230 is electrically connected with the underlying transistor 30 through the via 226.

Figure 6:
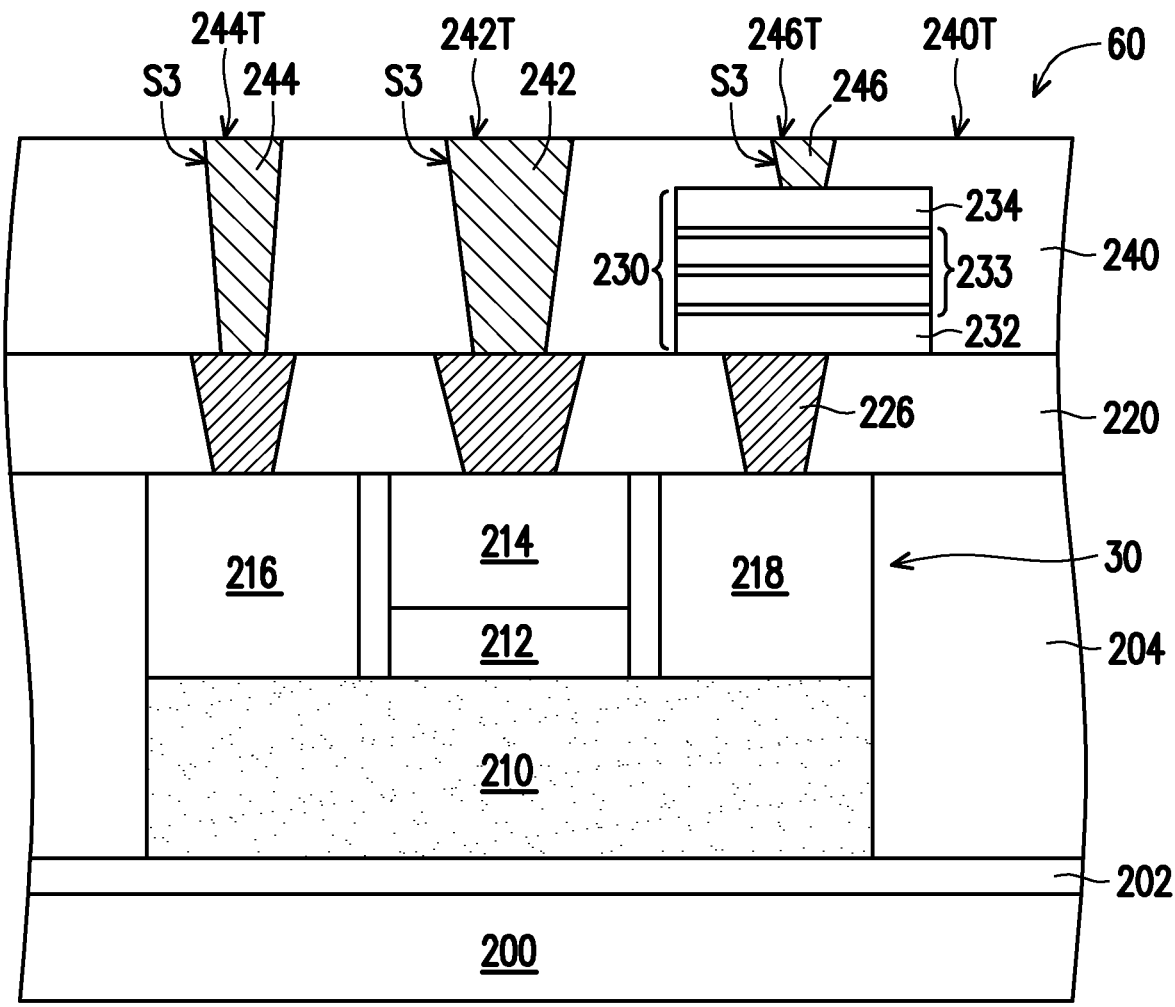

Referring to FIG. 6, another ILD layer 240 is formed on the ILD layer 220, covering the stacked structure 230 and the vias 222 and 224. In some embodiments, the ILD layer 240 includes via openings S3 respectively exposing the top surfaces of the underlying vias 222 and 224 and the top surface of the stacked structure 230 (i.e. exposing the top electrode layer 234). Later, vias 242, 244 and 246 are formed within the via openings S3 and are respectively connected to the underlying vias 222 and 224 and the top electrode layer 232 of the stacked structure 230. In some embodiments, the vias 242, 244 and 246 are formed by filling the via openings S3 with a metal material (not shown) by performing a plating process such as electrochemical plating (ECP) or electroless plating, a PVD process or a CVD process. In some embodiments, the metal material for the vias 242, 244 and 246 includes, for example, copper, copper-aluminum alloys, tantalum, titanium, tungsten, cobalt alloys thereof, or other suitable metal materials. In some embodiments, the extra metal material may be removed by performing a planarization process, an etching process, or other suitable processes. In some embodiments, a CMP process is performed, as seen in FIG. 4, the top surface 240T of the ILD layer 240 is substantially flush with and levelled with the top surfaces 242T, 244T and 246T of the vias 242, 244 and 246.

Referring to FIG. 6, the semiconductor device structure 60 is formed, including the stacked structure 230 connected with the transistor structure 30. In some embodiments, the vias 222, 224, 226, 242, 244 and 246 are parts of the interconnect structure, so that the ferroelectric capacitor 50 is electrically connected with the drain terminal 218 of the transistor structure 30, and the transistor structure 30 is further electrical connected to other components or devices through the vias formed on the contact terminals 216, 218 and the gate structure 215 of the transistor structure 30. In some embodiments, the interconnect structure may further include metal lines and metal vias connected to the metal lines. Although it's not shown in the figures, the vias 222, 224, 226, 242, 244 and 246, metal lines and metal vias in the interconnect structure may be formed with the liner layer(s), seed layer and/or barrier/adhesion layer, and multiple levels of interconnect structures may be formed for electrical connection and interconnection.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 7:
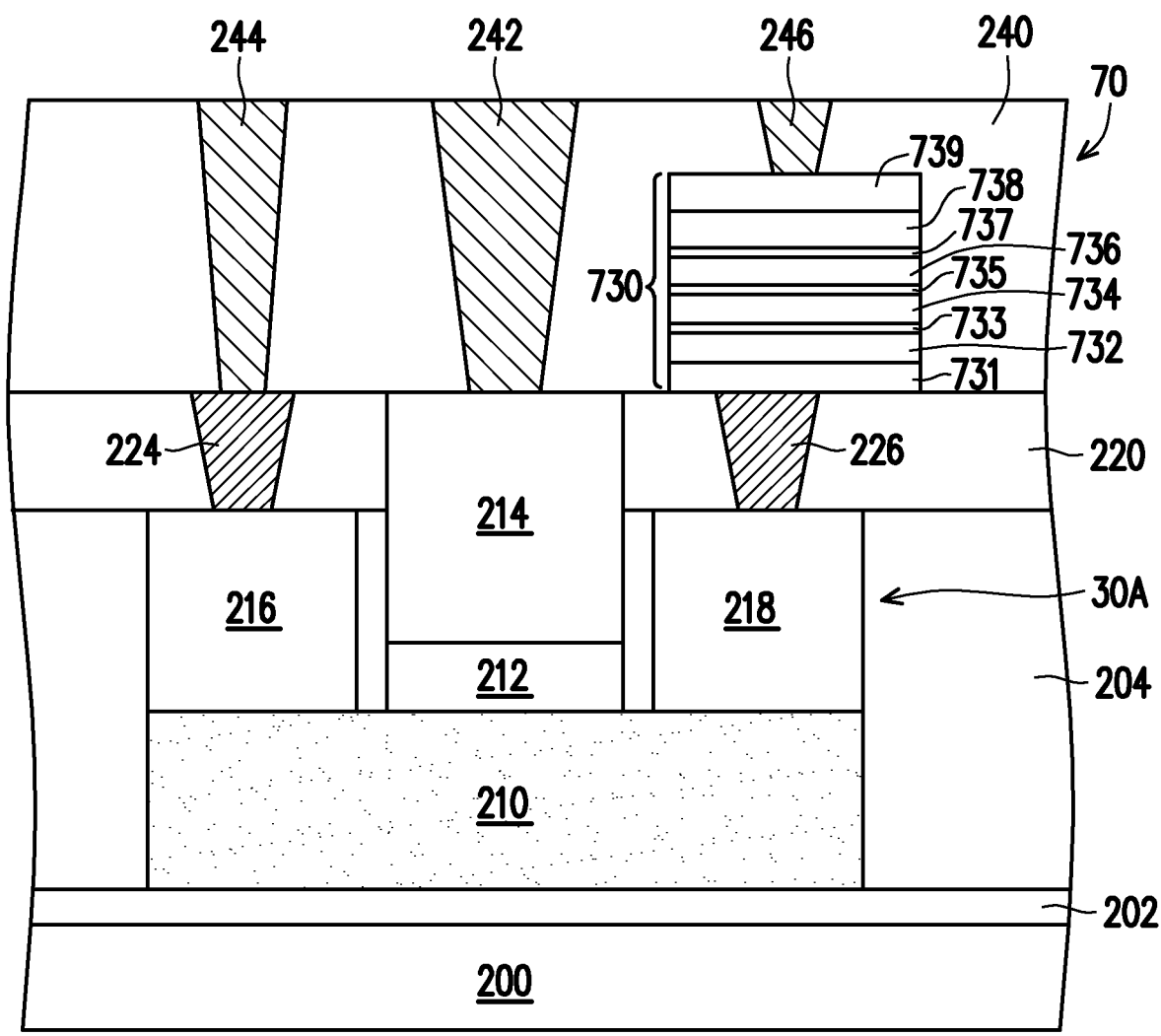
FIG. 7 is a schematic cross-sectional view showing a semiconductor device in accordance with some embodiments of the disclosure.

FIG. 7 is a schematic cross-sectional view showing a semiconductor device in accordance with some embodiments of the disclosure. The exemplary structure shown in FIG. 7 may be fabricated following the process steps as described in the previous embodiments as shown from FIG. 2 to FIG. 6, but it is understood that any other compatible process steps or methods may be utilized and comprehensible modifications or adjustments may be made for forming the exemplary structure of this disclosure.

Referring to FIG. 7, in some embodiments, the semiconductor device structure 70 includes a transistor structure 30A including a semiconductor material layer 210, source and drain terminals 216 and 218 disposed directly on the semiconductor material layer 210 and a gate structure 215 of a gate layer 214 and a gate dielectric layer 212 disposed on the semiconductor material layer 210. In some embodiments, the semiconductor device structure 70 is formed over the substrate 200 and on the dielectric layer 202. In some embodiments, the gate structure 215, the source terminal 216 and the drain terminal 218 are separate from each other by an ILD layer 204 located there-between. In some embodiments, the structure 70 further includes a stacked structure 730 embedded in another ILD layer 240 and vias 224, 226, 242, 244 and 246 formed in the ILD layers 204 and 240. In some embodiments, the stacked structure 730 is electrically connected with the transistor structure 30A through the via 226. Applicable materials for individual layers or elements are described in the previous embodiments and will not be repeated herein again.

Referring to FIG. 7, in some embodiments, the stacked structure 730 includes a bottom electrode layer 731, a top electrode layer 739 and a multi-layered ferroelectric stack 7FS sandwiched there-between. As seen in FIG. 7, in some embodiments, the structure of the ferroelectric stack 7FS including a first ferroelectric layer 732, a first stabilizing layer 733, a second ferroelectric layer 734, a second stabilizing layer 735, a third ferroelectric layer 736, a third stabilizing layer 737 and a fourth ferroelectric layer 738 vertically stacked in sequence (from bottom to top) is sandwiched between the bottom electrode layer 731 and the top electrode layer 739. Similar materials and formation methods applicable for the ferroelectric layer(s) and the stabilizing layer(s) as described in the previous embodiments may be utilized and will not repeated herein.

In some embodiments, the ferroelectric layer(s) of the multi-layered ferroelectric stack 7FS includes hafnium zirconium oxide, and the stabilizing layer(s) includes indium oxide and/or cerium oxide. In some embodiments, each ferroelectric layer 732, 734, 736 or 738 has individual thicknesses ranging from about 30 Angstroms to about 90 Angstroms, or about 50 Angstroms to about 80 Angstroms. In some embodiments, each stabilizing layer 733, 735, or 737 has individual thicknesses ranging from about 1 Angstrom to about 10 Angstroms, or other suitable range.

As seen in FIG. 7, in some embodiments, the stabilizing layers 733, 735 and 737 are respectively located between the above and below ferroelectric layers 732/734, 734/736 and 736/738. In FIG. 7, the first ferroelectric layer 732 physically contacts the bottom electrode layer 731, the fourth ferroelectric layer 738 physically contacts the top electrode layer 739. In some embodiments, the stabilizing layers 733, 735 and 737 that are respectively located between the above and below ferroelectric layers 732/734, 734/736 and 736/738 function as dopant provider at the interfaces with the above and below ferroelectric layers, which promotes the increase of the remnant polarization of the ferroelectric layers. In FIG. 7, in some embodiments, the stabilizing layers 733, 735 and 737 can stabilize the ferroelectric phase of the later formed ferroelectric layers.

Figure 8:
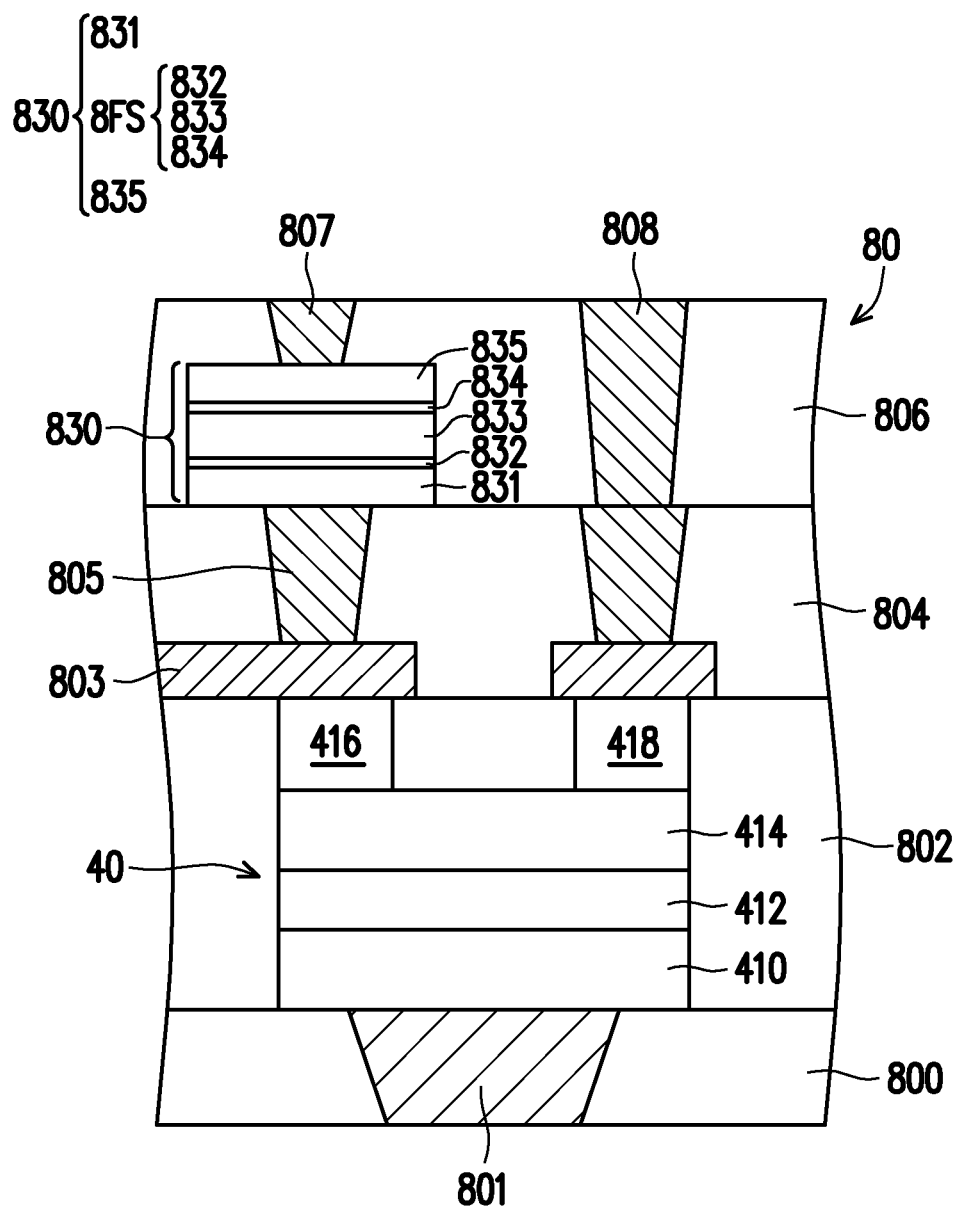
FIG. 8 is a schematic cross-sectional view showing a semiconductor device in accordance with some embodiments of the disclosure.

FIG. 8 is a schematic cross-sectional view showing a semiconductor device in accordance with some embodiments of the disclosure. In FIG. 8, the semiconductor device structure 80 includes a transistor structure 40 and a stacked structure 830 electrically connected with the transistor structure 40. In some embodiments, a transistor structure 40 is formed on a substrate 800 and embedded in the ILD layer 802. The substrate 800 is similar to the substrate 200 in the previous embodiments, and the substrate 800 includes at least a conductive contact 801 and may include one or more active component such as transistors, diodes, optoelectronic devices and/or one or more passive components such as capacitors, inductors and resistors. In some embodiments, the transistor structure 40 includes a stack of a gate layer 410, the gate dielectric layer 412, the semiconductor layer 414 sequentially stacked (from bottom to top), and the contact terminals 416 and 418 located on the semiconductor layer 414 of the stack. In some embodiments, the semiconductor layer 414 functions as a channel layer, and the contact terminals 416 and 418 function as the source and drain terminals. In some embodiments, the transistor structure 40 is a bottom-gated transistor structure or a back-gate transistor structure. In some embodiments, the transistor structure 40 is electrically connected to the conductive contact 801 of the substrate 800.

Referring to FIG. 8, another ILD layer 804 is formed on the ILD layer 802, and metal lines 803 and metal vias 805 are formed on and connected with the contact terminals 416 and 418. In some embodiments, a stacked structure 830 is formed on the ILD layer 804 and is connected to the via 805, and the stacked structure 830 is electrically connected with the contact terminal 418 of the transistor structure 40 through the metal line(s) 803 and the metal via(s) 805. In FIG. 8, after the stacked structure 830 is formed, another ILD layer 806 is formed on the ILD layer 804 covering the stacked structure 830, and metal vias 807 and 808 are respectively formed on and connected with the stacked structure 830 and the metal via 805. Applicable materials and formation methods for individual layers or elements may be similar to those layers or elements as described in the previous embodiments and will not be repeated herein again.

Referring to FIG. 8, in some embodiments, the stacked structure 830 includes a bottom electrode layer 831, a top electrode layer 835 and a multi-layered ferroelectric stack 8FS sandwiched there-between. As seen in FIG. 8, in some embodiments, the structure of the ferroelectric stack 8FS including a first stabilizing layer 832, a ferroelectric layer 833, and a second stabilizing layer 834 vertically stacked in sequence (from bottom to top) is sandwiched between the bottom electrode layer 831 and the top electrode layer 835. Similar materials and formation methods applicable for the electrode layers, the ferroelectric layer(s) and the stabilizing layer(s) as described in the previous embodiments may be utilized and will not repeated herein.

In some embodiments, the ferroelectric layer(s) of the multi-layered ferroelectric stack 8FS includes hafnium zirconium oxide, and the stabilizing layer(s) includes indium oxide and/or cerium oxide. In some embodiments, the ferroelectric layer 833 has a thicknesses ranging from about 30 Angstroms to about 90 Angstroms, or about 50 Angstroms to about 80 Angstroms, each stabilizing layer 832 or 834 has individual thicknesses ranging from about 1 Angstrom to about 10 Angstroms, and the total thickness of the ferroelectric stack 8FS is less than 100 Angstroms.

Figure 9:
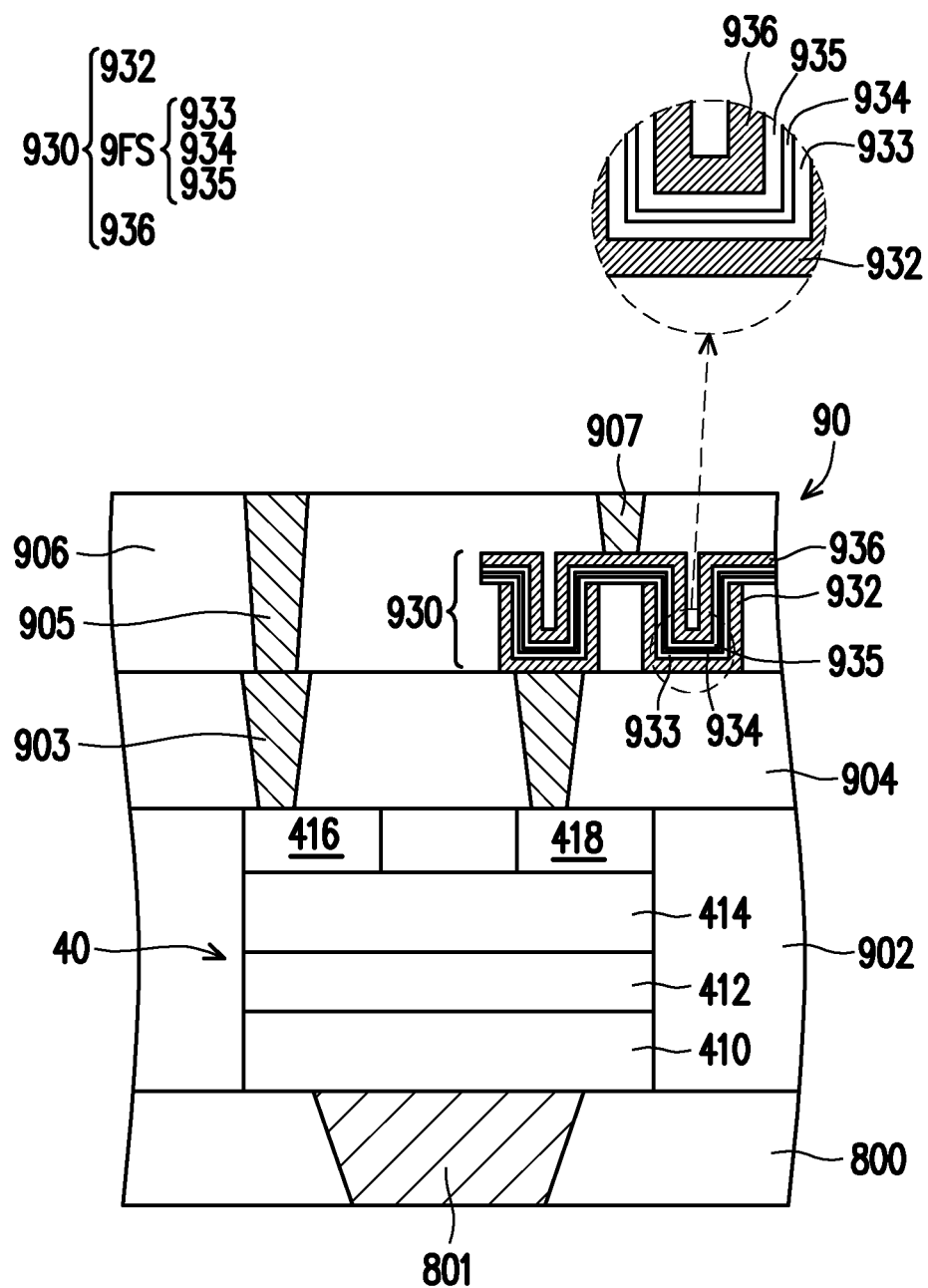
FIG. 9 is a schematic cross-sectional view showing a semiconductor device in accordance with some embodiments of the disclosure.

FIG. 9 is a schematic cross-sectional view showing a semiconductor device in accordance with some embodiments of the disclosure. In FIG. 9, the semiconductor device structure 90 includes a transistor structure 40 over a substrate 800 and a stacked structure 930 electrically connected with the transistor structure 40. In some embodiments, the transistor structure 40 is similar to the transistor structure 40 as described in FIG. 8, and same reference numbers are used to label the same or similar elements. In some embodiments, the transistor structure 40 is electrically connected to the conductive contact 801 of the substrate 800, and the substate 800 is the same as or similar to the substrate 200 or 800 as described in the above embodiments. In FIG. 9, the transistor structure 40 formed on the substrate 800 is embedded in an ILD layer 902. In some embodiments, another ILD layer 904 is formed on the ILD layer 902, and metal vias 903 are formed on and connected with the contact terminals 416 and 418. In some embodiments, a stacked structure 930 is formed on the ILD layer 904 and is connected to the via 903, and the stacked structure 930 is electrically connected with the contact terminal 418 of the transistor structure 40 through the metal via(s) 903. In FIG. 9, after the stacked structure 930 is formed, another ILD layer 906 is formed on the ILD layer 904 covering the stacked structure 930, and metal vias 905 and 907 are respectively formed on and connected with the metal via 903 and the stacked structure 930. Applicable materials and formation methods for individual layers or elements may be similar to those layers or elements as described in the previous embodiments and will not be repeated herein again.

Referring to FIG. 9, in some embodiments, the stacked structure 930 includes a bottom electrode layer 932, a top electrode layer 936 and a multi-layered ferroelectric stack 9FS sandwiched there-between. As seen in FIG. 9, in some embodiments, the structure of the ferroelectric stack 9FS including a first ferroelectric layer 933, a stabilizing layer 934, and a second ferroelectric layer 935 vertically stacked in sequence (from bottom to top) is sandwiched between the bottom electrode layer 932 and the top electrode layer 936. Similar materials and formation methods applicable for the electrode layers, the ferroelectric layer(s) and the stabilizing layer(s) as described in the previous embodiments may be utilized and will not repeated herein.

In some embodiments, the ferroelectric layer(s) of the multi-layered ferroelectric stack 9FS includes hafnium zirconium oxide, and the stabilizing layer(s) includes indium oxide and/or cerium oxide. In some embodiments, each ferroelectric layer 933 or 935 has an individual thicknesses ranging from about 50 Angstroms to about 100 Angstroms, or about 60 Angstroms to about 80 Angstroms, the stabilizing layer 934 has a thicknesses ranging from about 1 Angstrom to about 10 Angstroms, and the total thickness of the ferroelectric stack 8FS is more than 100 Angstroms. In some embodiments, the ferroelectric stack 9FS is or includes a trench type capacitor structure.

Figure 10:
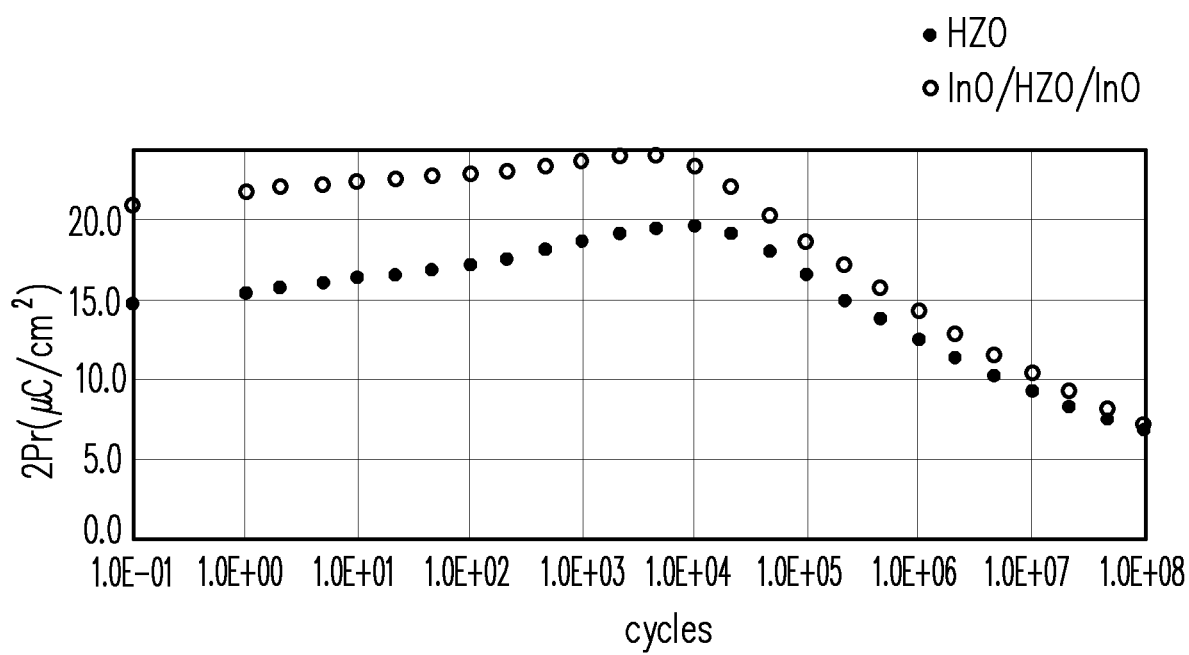
FIG. 10 is a graph showing the remnant polarization (2Pr) versus cycles of a ferroelectric layer and a ferroelectric stack of a memory device according to embodiments of the present disclosure.

FIG. 10 is a graph showing the remnant polarization (2Pr) versus cycles of a ferroelectric layer and a ferroelectric stack of a memory device according to embodiments of the present disclosure. In FIG. 10, the curve of the solid dots represents the ferroelectric data of a metal-ferroelectric-metal (MFM) capacitor stack having only a hafnium zirconium oxide (HZO) ferroelectric layer (of about 80 Angstroms thickness), while the curve of the hollow circles represents the ferroelectric data of a MFM capacitor having a ferroelectric stake of indium oxide layer/HZO layer/indium oxide layer (of about 1 Angstrom/80 Angstroms/1 Angstrom). As seen in FIG. 10, compared with the ferroelectric characteristics of the capacitor having the HZO layer, the capacitor having the ferroelectric stack InO/HZO/InO has a higher starting value of remnant polarization (2Pr) and a higher maximum remnant polarization value, and the increase can be up to about 40-50%. Also, the capacitor having the ferroelectric stack InO/HZO/InO shows outstanding endurance characteristics for keeping 2Pr value higher than 20 $\mu C/cm^2$ after 10000 cycles and the capacitor shows no breakdown up to 108-109 cycles.

According to some embodiments of the present disclosure, the inclusion of the stabilizing layer(s) into the ferroelectric layer(s) can promote the formation of the ferroelectric phase crystals in the ferroelectric layer(s), prohibit the formation of non-ferroelectric phases and improve the ferroelectric property of the ferroelectric layer(s). For a ferroelectric memory device, the addition/inclusion of the stabilizing layer(s) to the ferroelectric film(s) helps to enhance the ferroelectric property and achieve good endurance performance of the ferroelectric capacitor. The memory device structure disclosed in the embodiments of the present application are suitable for ferroelectric devices manufacturing using back-end-of-line processes and ferroelectric-based flexible device applications.

In accordance with some embodiments of the disclosure, a memory device is described. The memory device includes a transistor structure over a substrate and a ferroelectric capacitor structure electrically connected with the transistor structure. The ferroelectric capacitor structure includes a top electrode layer, a bottom electrode layer and a ferroelectric stack sandwiched there-between. The ferroelectric stack includes a first ferroelectric layer, a first stabilizing layer, and one of a second ferroelectric layer or a second stabilizing layer. Materials of the first stabilizing layer and a second stabilizing layer include a metal oxide material.

In accordance with some embodiments of the disclosure, a memory device is described. The memory device includes a transistor structure embedded in a first dielectric layer over a semiconductor substrate, a ferroelectric capacitor structure, a second dielectric layer and at least one via. The ferroelectric capacitor structure is disposed on the first dielectric layer and above the transistor structure. The ferroelectric capacitor structure is electrically connected with the transistor structure. The ferroelectric capacitor structure includes a top electrode layer, a bottom electrode layer and a ferroelectric stack sandwiched there-between. The ferroelectric stack includes at least two ferroelectric layers with a stabilizing layer sandwiched there-between or at least two stabilizing layers with a ferroelectric layer sandwiched there-between. Each stabilizing layer included a metal oxide material. The second dielectric layer is disposed on the first dielectric layer and covers the ferroelectric capacitor structure. The at least one via is disposed in the second dielectric layer, and the at least one via is connected with the transistor structure and the ferroelectric capacitor structure.

In accordance with some embodiments of the disclosure, a manufacturing method of a memory device is provided. A substrate having a first dielectric layer formed thereon is provided. A transistor structure is formed in the first dielectric layer. At least a via is formed and is connected to the transistor structure. A multilayered stack is formed on the first dielectric layer and over the transistor structure by forming at least two ferroelectric layers with a stabilizing layer sandwiched there-between or forming at least two stabilizing layers with a ferroelectric layer sandwiched there-between. The multilayered stack is patterned to form a ferroelectric capacitor structure having a ferroelectric stack over the transistor structure. A second dielectric layer is formed on the first dielectric layer and covers the ferroelectric stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a substrate having a dielectric layer thereon with a metallic via therein;
a transistor structure disposed on the metallic via and the dielectric layer, wherein the transistor structure includes:
a gate layer disposed on and in contact with the metallic via;
a gate dielectric layer and a semiconductor channel layer disposed on the gate layer; and
source and drain terminals on the semiconductor channel layer; and
a ferroelectric capacitor structure electrically connected with the transistor structure, wherein the ferroelectric capacitor structure includes a top electrode layer, a bottom electrode layer and a ferroelectric stack sandwiched there-between, and the ferroelectric stack includes a first ferroelectric layer, a first stabilizing layer, and one of a second ferroelectric layer or a second stabilizing layer, and materials of the first stabilizing layer and a second stabilizing layer include a metal oxide material.

2. The memory device of claim 1, wherein the ferroelectric stack includes the first ferroelectric layer, the first stabilizing layer, and the second ferroelectric layer stacked in sequence, and the first stabilizing layer separates the first and second ferroelectric layers.

3. The memory device of claim 2, further comprising the second stabilizing layer disposed between the first ferroelectric layer and the bottom electrode layer and in contact with the bottom electrode layer, and a third stabilizing layer disposed between the second ferroelectric layer and the top electrode layer and in contact with the top electrode layer.

4. The memory device of claim 1, wherein the ferroelectric stack includes the first stabilizing layer, the first ferroelectric layer, and the second stabilizing layer stacked in sequence, and the first ferroelectric layer separates the first and second stabilizing layers.

5. The memory device of claim 4, further comprising the second ferroelectric layer disposed between the first stabilizing layer and the bottom electrode layer and in contact with the bottom electrode layer, and a third ferroelectric layer disposed between the second stabilizing layer and the top electrode layer and in contact with the top electrode layer.

6. The memory device of claim 1, wherein a material of the first ferroelectric layer or the second ferroelectric layer includes hafnium zirconium oxide (HfZrO), zirconium oxide (ZrO), hafnium oxide undoped or doped with lanthanum (La), silicon (Si), or aluminum (Al).

7. The memory device of claim 1, wherein the metal oxide material of the first stabilizing layer or the second stabilizing layer includes at least one selected from indium oxide, gallium oxide, tantalum oxide, lanthanum oxide, cerium oxide, yttrium oxide, and scandium oxide.

8. The memory device of claim 1, further comprising an inter-dielectric layer disposed over the transistor structure and covering the ferroelectric capacitor structure and a via disposed in the inter-dielectric layer and between the ferroelectric capacitor structure and the transistor structure.

9. The memory device of claim 8, wherein the ferroelectric capacitor structure is electrically connected with the drain terminal of the transistor structure through the via, and the ferroelectric capacitor structure is a trench type capacitor structure.

10. A memory device, comprising:
a semiconductor substrate including a semiconductor device and a metallic via electrically connected with the semiconductor device;
a transistor structure embedded in a first dielectric layer and electrically connected with the semiconductor device through the metallic via in the semiconductor substrate, wherein the transistor structure includes:
a gate layer disposed on and in contact with the metallic via;
a gate dielectric layer and a semiconductor channel layer disposed on the gate layer; and
source and drain terminals on the semiconductor channel layer;
a ferroelectric capacitor structure, disposed on the first dielectric layer and above the transistor structure, wherein the ferroelectric capacitor structure is electrically connected with the transistor structure, and the ferroelectric capacitor structure includes a top electrode layer, a bottom electrode layer and a ferroelectric stack sandwiched there-between, and the ferroelectric stack includes at least two ferroelectric layers with a stabilizing layer sandwiched there-between or at least two stabilizing layers with a ferroelectric layer sandwiched there-between, and each stabilizing layer included a metal oxide material;
a second dielectric layer disposed on the first dielectric layer and covering the ferroelectric capacitor structure; and
at least one via disposed in the second dielectric layer, wherein the at least one via is connected with the transistor structure and the ferroelectric capacitor structure.

11. The memory device of claim 10, wherein the ferroelectric stack includes a first ferroelectric layer, a first stabilizing layer, and a second ferroelectric layer stacked in sequence, and the first ferroelectric layer contacts the bottom electrode layer, the second ferroelectric layer contacts the top electrode layer, and the first stabilizing layer separates the first and second ferroelectric layers.

12. The memory device of claim 10, wherein the ferroelectric stack includes a first stabilizing layer, a first ferroelectric layer, and a second stabilizing layer stacked in sequence, the first stabilizing layer contact the bottom electrode layer, the second stabilizing layer contacts the top electrode layer, and the first ferroelectric layer separates the first and second stabilizing layers.

13. The memory device of claim 10, wherein the ferroelectric stack includes a first ferroelectric layer, a first stabilizing layer, a second ferroelectric layer, a second stabilizing layer, a third ferroelectric layer, a third stabilizing layer and a fourth ferroelectric layer stacked in sequence, and the first ferroelectric layer contacts the bottom electrode layer, the fourth ferroelectric layer contacts the top electrode layer, and the first, second and third stabilizing layers individually separates the above and below ferroelectric layers.

14. The memory device of claim 10, wherein the ferroelectric stack includes a first stabilizing layer, a first ferroelectric layer, a second stabilizing layer, a second ferroelectric layer and a third stabilizing layer stacked in sequence, the first stabilizing layer contact the bottom electrode layer, the third stabilizing layer contacts the top electrode layer, and the second stabilizing layer separates the first and second ferroelectric layers.

15. The memory device of claim 10, wherein the metal oxide material includes at least one selected from indium oxide, gallium oxide, tantalum oxide, lanthanum oxide, cerium oxide, yttrium oxide, and scandium oxide.

16. The memory device of claim 10, wherein a material of the ferroelectric stack includes hafnium zirconium oxide (HfZrO), zirconium oxide (ZrO), hafnium oxide undoped or doped with lanthanum (La), silicon (Si), or aluminum (Al).

17. The memory device of claim 11, wherein the semiconductor device and the metallic via are located at a first level lower than a second level at which the transistor structure and the ferroelectric capacitor structure are located.

* * * * *